United States Patent [19]
Luzzatto et al.

[11] Patent Number: 5,799,246
[45] Date of Patent: Aug. 25, 1998

[54] RADIO WITH SYNTHESIZER AND VCO

[75] Inventors: Ariel Luzzatto, Tel Aviv; Moshe Ben-Ayun; Roni Shamsian, both of Holon; Ilan Y. Horowitz, Nes-Ziona, all of Israel

[73] Assignee: Motorola, Inc., Schaumburg, Ill.

[21] Appl. No.: 263,294

[22] Filed: Jun. 21, 1994

[51] Int. Cl.$^6$ ................................................. H04B 1/40
[52] U.S. Cl. ........................................ 455/76; 455/114
[58] Field of Search ................................ 455/75, 76, 77, 455/113, 114, 117, 118, 119, 260, 310, 317, 318; 327/156, 157, 158, 159; 331/17, 25, 108 D

[56] References Cited

U.S. PATENT DOCUMENTS

| | | | |
|---|---|---|---|
| 557,244 | 9/1896 | Salvi | 455/75 |
| 4,231,116 | 10/1980 | Sekiguchi et al. | 455/119 |
| 5,258,997 | 11/1993 | Fraser et al. | 455/75 |
| 5,534,823 | 7/1996 | Kondou | 455/260 |
| 5,650,754 | 7/1997 | Joshi et al. | 455/260 |

Primary Examiner—Reinhard J. Eisenzopf
Assistant Examiner—Marsha D. Banks-Harold
Attorney, Agent, or Firm—M. Mansour Ghomeshi

[57] ABSTRACT

A radio is described having a synthesizer (17) and a VCO (18). Each of the synthesizer and the VCO has a connection to a ground plane (13) of the radio. The ground plane connection of the VCO has a first capacitor (43) and a further ground connection (40) is provided between the VCO and the synthesizer for providing a common baseband ground for the VCO and the synthesizer, isolated with respect to baseband frequency currents in the ground plane of the radio. The arrangement addresses problems arising in radios having power amplifiers with severe output amplifier variations, such as are found in linear radios.

19 Claims, 2 Drawing Sheets

5,799,246

RADIO WITH SYNTHESIZER AND VCO

FIELD OF THE INVENTION

This invention relates to a radio having a synthesizer and a VCO and, for example, addresses problems arising in radios having power amplifiers with severe output amplifier variations, such as are found in linear radios.

BACKGROUND TO THE INVENTION

In mobile radios operating on time division multiplex (TDM) protocols, for example radios operating on linear modulation schemes, a power amplifier of the radio needs to be opened and closed very quickly, that is to say powered-up and powered-down over many decibels in very short periods of time.

It is common to use a synthesizer and a voltage controlled oscillator (VCO) in such radios, for example for generating injection signals, and it is common to mount the VCO, the synthesizer and the power amplifier on a single printed circuit board or multi-chip module having a common ground connection.

Experiments have shown that parasitic frequency modulation of the power amplifier output occurs and is a major problem.

There is a need for an improved radio.

SUMMARY OF THE INVENTION

A radio is provided comprising a synthesizer and a VCO, each of the synthesizer and the VCO having a connection to a ground plane of the radio, the ground plane connection of the VCO having a first capacitor and a further ground connection being provided between the VCO and the synthesizer for providing a common baseband ground for the VCO and the synthesizer, isolated with respect to baseband frequency currents in the ground plane of the radio.

The inventors have recognized that parasitic frequency modulation is caused by baseband modulated current in the power amplifier, in turn caused by the envelope of the RF output. The inventors have identified that in linear radios the nonconstant envelope signal modulates the dc current of the power amplifier, which in turn modulates the frequency of the VCO. Moreover, the major mechanism causing parasitic frequency modulation has been identified as residual ground current acting on the VCO steering line. Because of the physical distance between the synthesizer (more specifically its associated loop filter) and the VCO varactor (or "varicap") diode, there is a baseband voltage source appearing across the varactor due to ground currents.

The present invention operates to reduce or eliminate the effect of these currents on the VCO.

A preferred embodiment of the invention is now described, by way of example only, with reference to the drawings.

DETAILED DESCRIPTION OF THE DRAWINGS AND THE PREFERRED EMBODIMENT

Figure 1:
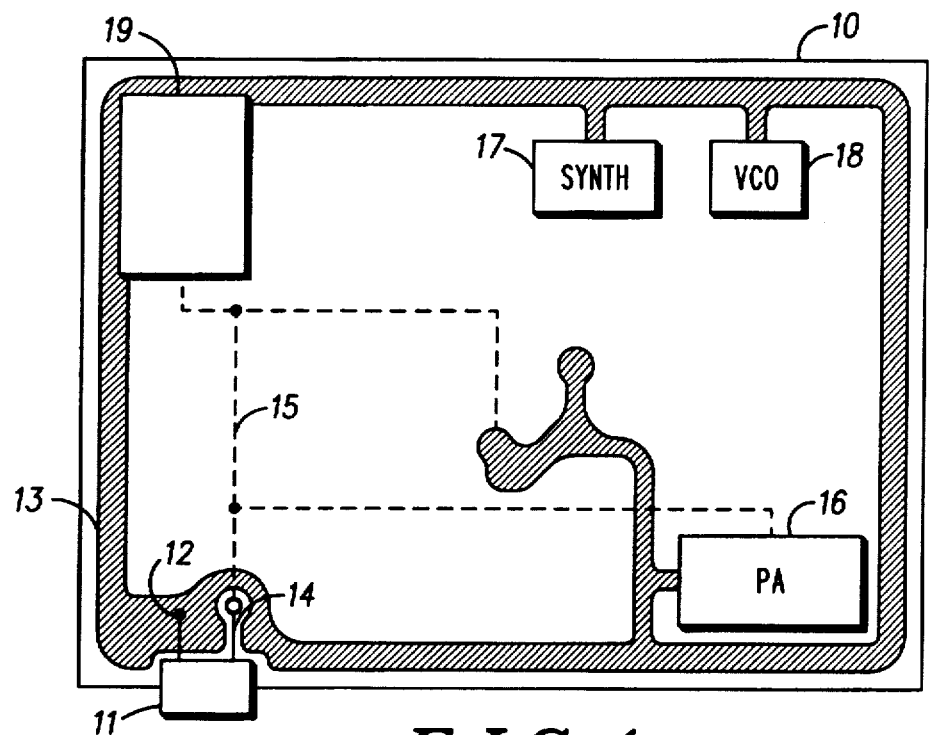
FIG. 1 shows a typical prior art radio transceiver.

Referring to FIG. 1, a radio transceiver is shown having a printed circuit board (PCB) 10 with a power connector 11 mounted thereon, the power connector 11 having a negative connection 12 connected to a ground track 13 printed on the circuit board 10. The connector 11 has a positive connection 14 connected to positive power tracks 15 which need not be considered in detail. The ground track 13 extends to various parts of the board 10 wherever a ground connection is needed and typically extends to any surfaces of the board 10 not required for other connections. Also mounted on the board 10 are power amplifier 16, a synthesizer 17, a voltage controlled oscillator 18 (VCO) and other circuitry 19.

Where the power amplifier 16 has a non constant envelope, as is typical in linear radios, for example operating on time division multiplex radio systems, the amplifier draws a DC current from the power input 11 which is effectively modulated (non constant) and gives rise to a ground current in the track 13, the path of which is irregular and may extend between the ground connection of synthesizer 17 and the ground connection of the VCO 18.

Figure 2:
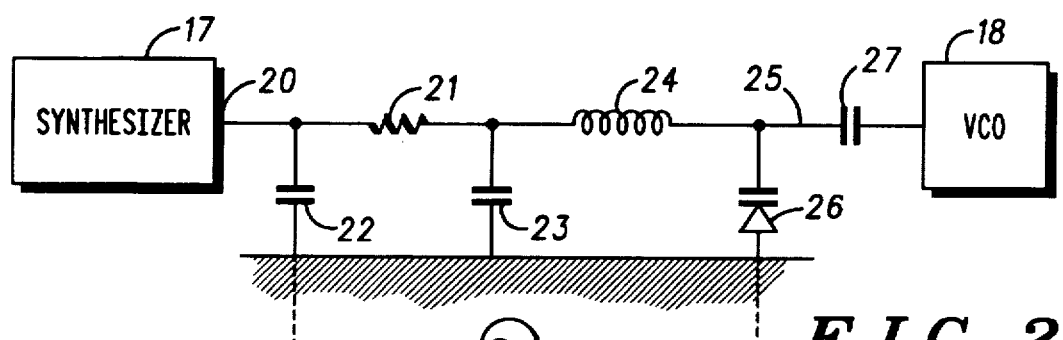
FIG. 2 shows detail of the synthesizer and VCO of the transceiver of FIG. 1.

The synthesizer 17 and VCO 18 are shown in greater detail in FIG. 2. As is shown, at an output 20 of the synthesizer 17 there is a loop filter comprising a resistor element 21 and two capacitors 22 and 23. This loop filter is connected via a choke 24 to a steering line 25 for the VCO 18, which is connected to the anode of a varactor diode 26 and via a capacitor 27 to the VCO 18.

Residual ground current represented by a signal generator 28 in effect acts on the cathode of the varactor diode 26 and causes parasitic FM modulation of the VCO 18.

The VCO is one of the most sensitive elements in a radio. In modern radios, there is a need for 80 dB of separation between on-channel and out-of-channel signals, an 80 dB drop being the equivalent to 1 part in 100 million. Where a VCO has a typical frequency response of 3 MHz per volt, there is a need to reduce voltage changes in the steering line to the other of nanovolts.

Measurements in a typical case have shown that a PCB resistance between the ground connections of the synthesizer and VCO of about 0.8 milliohms exist and, from observations that sidebands in an operating radio exist at −55 dBc it can be calculated that ground currents of 2 mA exist at 3 kHz.

Figure 3:
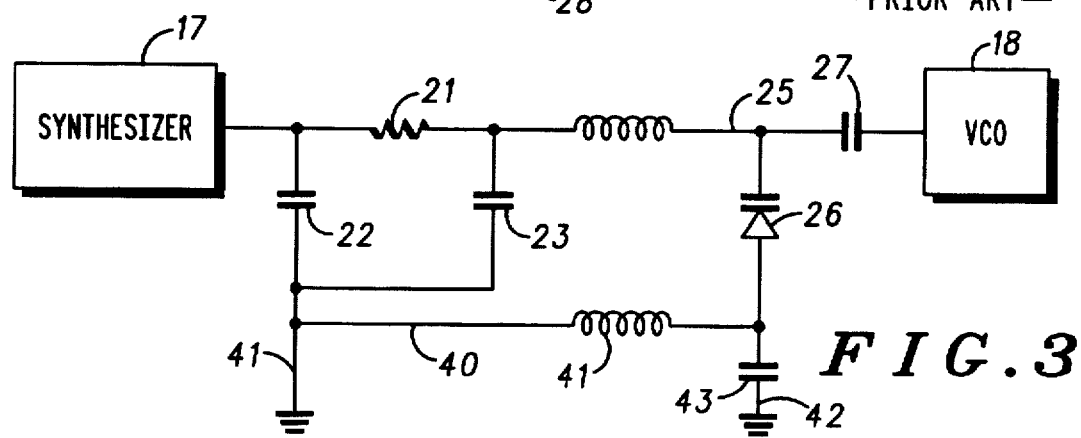
FIG. 3 shows elements of a radio transceiver in accordance with the preferred embodiment of the invention.

The circuit can be improved as shown in FIG. 3. In this figure, a "cold" steering line 40 extends between the earth connection 44 for the low pass filter (comprising the capacitors 22 and 23 and the resistor 21) and the cathode of the varactor diode 26. In this cold steering line there is an optional choke 41. Between the cathode of the varactor diode 26 and its ground connection 42, there is a capacitor 43.

Considering first the case where there is no choke 41 and the cold steering line 40 extends between the ground point 44 and the cathode of the varactor diode 26, in this case, capacitor 43 should have a capacitance substantially exceeding the capacitance of capacitor 27.

Experiments have shown that the additional capacitor 43 isolates baseband frequency currents in the ground plane, cutting out any baseband voltage on the varactor diode 26 caused by ground current and causing sidebands to drop below −70 dBc.

Experiments have shown that the serial resistance of capacitor 43 causes some degradation in VCO phase noise. This is improved with use of the choke 41.

Considering the case where capacitor 27 of FIG. 2 has a value equal to C by setting the capacitance of capacitors 27' and 43 of FIG. 3 equal to 2C, each, the total capacitance at the input to the VCO remains the same (C) and the serial resistance created by capacitor 43 is negligible.

The choke 41 has the advantage of blocking rf noise, or rf signals that may be generated by the synthesizer 17, from the "ground" connection of the VCO 18—ie the cathode of the varactor diode 26.

It is preferred that the cold steering line 40 has approximately the same length as the steering line 25. It is additionally preferred that the two lines follow approximately the same path, for example running parallel to each other. With this feature, any induced voltage in one line is likely to be induced in the other line, therefore canceling each other out at the varactor diode 26.

Figure 4:
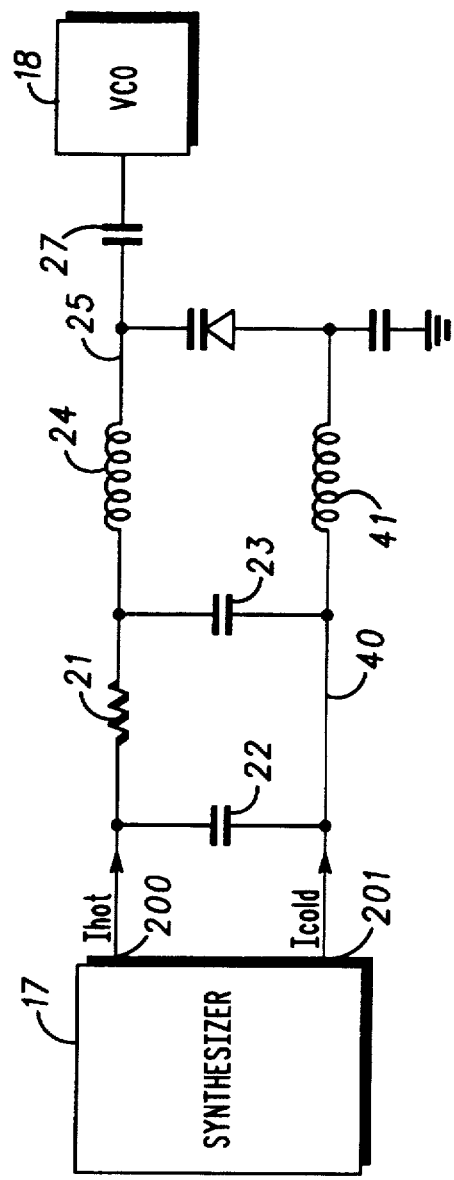
FIG. 4 shows elements of a radio transceiver in accordance with an alternative embodiment of the invention.

For improved operation, a differential charge pump can be used as shown in FIG. 4.

In this figure, the synthesizer 17 is shown as having hot and cold charge pump outputs 200 and 201 respectively.

One charge pump output 200 charges and discharges the loop filter 21, 22, 23. This can cause parasitic ground noise between the loop filter ground 41 and the synthesizer ground (not shown). The cold steering line 40 will not protect the VCO 18 against such a noise. Therefore, in the second embodiment, a differential charge pump is used.

Let I(reg) be the regular - non-differential - charge pump current. The differential charge pump outputs I(hot) and I(cold) control currents on outputs 200 and 201 respectively. The relationship between those currents is:

I(reg)=I(hot)−I(cold). So, a differential current is provided to the capacitor 22:

I(hot)=+0.5*I(reg)

I(cold)=−0.5*I(reg).

This will cancel out the noise that could be picked up because of the resistance of the ground between the loop filter ground 41 (FIG. 3) and the synthesizer ground.

We claim:

1. A radio including a synthesizer and a VCO, each of the synthesizer and the VCO having a connection to a ground plane of the radio, the radio comprising:

a first capacitor coupled to the ground plane connection of the VCO; and a further ground connection being provided between the VCO and the synthesizer for providing a common baseband ground for the VCO and the synthesizer, isolated with respect to baseband frequency currents in the ground plane of the radio.

2. A radio according to claim 1, wherein a second capacitor connects the synthesizer and the VCO and the first capacitor has a capacitance substantially exceeding the capacitance of the second capacitor.

3. A radio according to claim 2, wherein a steering line extends between the synthesizer and the VCO for control of the VCO by the synthesizer and wherein the further ground connection and the steering line have substantially equal lengths.

4. A radio according to claim 1, wherein said further ground connection has an inductive element for blocking RF from the VCO ground.

5. A radio according to claim 4, wherein a second capacitor connects the synthesizer and the VCO and the first capacitor and the second capacitor have equal capacitances.

6. A radio according to claim 5, wherein a steering line extends between the synthesizer and the VCO for control of the VCO by the synthesizer and wherein the further ground connection and the steering line have substantially equal lengths.

7. A radio according to claim 4, wherein a steering line extends between the synthesizer and the VCO for control of the VCO by the synthesizer and wherein the further ground connection and the steering line have substantially equal lengths.

8. A radio according to claim 1, wherein a steering line extends between the synthesizer and the VCO for control of the VCO by the synthesizer and wherein the further ground connection and the steering line have substantially equal lengths.

9. A radio according to claim 8, wherein the further ground connection and the steering line have extend along substantially parallel paths.

10. A radio according to claim 1, further comprising a filter having a resistive element and a capacitive element, for filtering the output of the synthesizer.

11. A radio according to claim 10, further comprising a differential charge pump for supplying a differential current to the capacitive element.

12. A radio according to claim 1, further comprising a printed circuit board on which the synthesizer and VCO are mounted, wherein the ground plane of the radio extends by means of a printed circuit board track from the synthesizer and the VCO to a power connector by more than one path.

13. A radio, comprising:

a synthesizer having an output port;

a low pass filter coupled between the output port and a first ground potential point;

a voltage-controlled oscillator (VCO);

a first capacitor having a first terminal coupled to the output of the synthesizer and a second terminal coupled to the VCO;

a varactor having anode and cathode terminals, the anode terminal of the varactor coupled to the first terminal of the first capacitor;

a second capacitor coupled between the cathode terminal of the varactor and a second ground potential point; and a steering line coupled between the first ground potential point and the cathode terminal of the varactor.

14. A radio as defined in claim 13, wherein the first capacitor has a larger capacitance value than the second capacitor.

15. A radio as defined in claim 13, wherein the first and second capacitors have substantially the same capacitance values.

16. A radio as defined in claim 13, further comprising a choke located in series with the steering line.

17. A radio, comprising:

a synthesizer including a differential charge pump having first and second charge pump outputs;

a loop filter coupled between the first charge pump output and a second charge pump output;

a voltage-controlled oscillator (VCO);

a first capacitor having a first terminal coupled to the loop filter and a second terminal coupled to the VCO;

a varactor having anode and cathode terminals, the anode terminal of the varactor coupled to the first terminal of the first capacitor and the cathode coupled to the second charge pump output; and a second capacitor coupled between the cathode terminal of the varactor and a ground potential point.

18. A radio as defined in claim 17, wherein the first capacitor has a larger capacitance value than the second capacitor.

19. A radio as defined in claim 17, further comprising:

a choke coupled between the second charge pump output and the cathode terminal of the varactor.

* * * * *